US006713750B2

(12) United States Patent
Goddard

(10) Patent No.: US 6,713,750 B2
(45) Date of Patent: Mar. 30, 2004

(54) VISIBLE LIGHT FORKLIFT ALIGNMENT APPARATUS

(76) Inventor: L. A. Goddard, 1 Laser La., Hazelhurst, GA (US) 31539

( * ) Notice: Subject to any disclaimer, the term of this patent is extended or adjusted under 35 U.S.C. 154(b) by 317 days.

(21) Appl. No.: 09/793,210

(22) Filed: Feb. 26, 2001

(65) Prior Publication Data

US 2002/0117607 A1 Aug. 29, 2002

(51) Int. Cl.[7] .............................................. H01L 37/30
(52) U.S. Cl. ...................................... 250/221; 340/557
(58) Field of Search ........................... 250/221, 559.04, 250/559.29, 559.3, 559.37, 559.4; 340/557, 566

(56) References Cited

U.S. PATENT DOCUMENTS

| | | | |
|---|---|---|---|
| 3,149,196 A | 9/1964 | Roth | |
| 3,672,470 A | 6/1972 | Ohntrup | |
| 3,854,820 A | 12/1974 | Hansen | |
| 4,279,328 A | 7/1981 | Ahlbom | |
| 5,208,753 A | 5/1993 | Acuff | |
| 6,120,052 A | 9/2000 | Capik et al. | |
| 6,150,938 A * | 11/2000 | Sower et al. | 340/557 |
| 6,388,748 B1 * | 5/2002 | Kokura | 356/399 |
| 6,411,210 B1 * | 6/2002 | Sower et al. | 340/557 |

* cited by examiner

*Primary Examiner*—David V. Bruce
*Assistant Examiner*—Hoon Song
(74) *Attorney, Agent, or Firm*—Thomas C. Saitta

(57) ABSTRACT

An apparatus which provides a visual indication to the operator of a forklift that the forks are properly vertically aligned, the apparatus having a laser module which produces a visible light beam at the same height as the forks creating a focused dot or similar shape on a solid object. The laser module is retained in a laser housing which is preferably mounted onto the carriage of the forklift between the forks. Vibration-responsive, height-responsive, distance-to-load-responsive and temperature-responsive actuation means, alone or in combination, control the operational state of the laser module.

20 Claims, 2 Drawing Sheets

VISIBLE LIGHT FORKLIFT ALIGNMENT APPARATUS

BACKGROUND OF THE INVENTION

This invention relates generally to the field of systems and devices used to align or provide an indication to the operator of the location of the forks on a forklift relative to the access openings in a pallet or the like, such that the operator knows when the forks are at the correct height for entry into the access openings. More particularly, the invention relates to such systems which utilize visible light means to provide a visual indicator to the forklift operator.

Forklifts or similar load handling equipment are designed to handle pallets and the like by inserting a pair of forks or tines into access openings provided between opposing deck members or the pallet legs for a single deck pallet. The forks are mounted in parallel on a carriage which can be raised or lowered vertically, and usually also tilted slightly, with the forks extending typically a distance four feet forward from the carriage. The front of each fork is tapered or beveled to allow for a small margin of error during the insertion process. Because it is usually desirable to minimize the amount of floor space taken up by stored goods, warehouses are provided with high ceilings and forklifts are designed to raise loads many feet off the ground such that multiple pallets can be stored in a vertical column. Thus, even though the operator is seated on the forklift itself and is therefore a few feet above ground level, the load may need to be deposited onto or retrieved from a stack, rack or shelf many feet above the operator's head. Because of this, the operator cannot easily determine if the forks are at the optimum height prior to advancing forward to retrieve or deposit the load onto the stack, rack or shelf. Adding to the is problem is the fact that the load itself may block the operator's line of sight. Thus operators are forced to estimate the correct height of the forks, then slowly advance the forks forward to determine, either by striking the shelf or rack when depositing, or by striking the shelf, rack, pallet or the load itself when retrieving, that the forks are misaligned. This technique can result in damage to the pallets or loads and to the shelves or racks.

There have been attempts made to address the problem of fork misalignment, for instance by providing visual indicators or intelligent alignment systems. For example, Ohntrup et al. in U.S. Pat. No. 3,672,470, issued on Jun. 27, 1972, teaches the use of a photoelectric system wherein a light source and a light sensor is mounted onto the fork. The sensor is designed to detect the difference in reflected light from a solid object versus reflected light from the access openings in the pallet, such that when the latter is detected a visible light indicator is turned on for the operator to indicate that the forks are properly aligned. This system is susceptible to false readings due to ambient light conditions, since strong or weak warehouse illumination may alter the sensitivity of the sensor. Furthermore, Ohntrup et al. teaches mounting the light source and light sensor within or onto the fork itself, which is undesirable in that the light source and light sensor can be easily damaged form routine use of the forklift. An example of a visible light system is taught by Hansen in U.S. Pat. No. 3,854,820, issued Dec. 17, 1974, where a light source capable of producing a collimated beam of light is mounted laterally onto each side of the forklift carriage, with the light beam projected through prisms to produce a fan-shaped or diverging plane of light. As with the Ohntrup et al. device, the exposed mounting of the light source leaves it susceptible to damage. Another drawback to the Hansen device is that the visual indicators are located to the outside of each fork, such that only a small amount if any of the light falls onto the actual pallet to be removed, with most of the light striking the shelving or pallets to either side of the target pallet. Thus the operator is forced to interpret the visual information and must check the visual indicators to both sides of the forks to determine if they are properly aligned. Complicated forklift alignment systems using cameras and microprocessors are shown in U.S. Pat. No. 4,279,328, issued Jul. 21, 1981 to Ahlbom, and in U.S. Pat. No. 5,208,753, issued May 4, 1993 to Acuff.

It is an object of this invention to provide a relatively simple system for assuring proper alignment of forklift forks, where a visible light indicator is provided to the operator, the light indicator being a focused dot or other shape produced by a controlled beam striking an opaque object. It is a further object to provide such a system where the light source is mounted in a manner which makes it less susceptible to accidental damage. It is a further object to provide such a system where the visible light indicator is a visible laser beam which is preferably centrally oriented relative to the forks. It is a further object to provide such a system which incorporates various safety features to minimize or eliminate possible damage to people from inadvertent exposure to the beam from the light source, and in particular a laser beam, by incorporating vibration-responsive, height-responsive and distance-to-load-responsive actuation means. It is a further object to provide such a system which incorporates various safety features to minimize or eliminate possible damage to the system itself, such as from excessively high or low ambient temperatures, by incorporating temperature-responsive actuation means.

SUMMARY OF THE INVENTION

The invention is in general an apparatus, device or system for providing a visual indication to a forklift operator of proper vertical alignment of the forks or tines of the forklift relative to the access openings designed to receive the forks of a pallet or like device for supporting a load, which may consist of a single or multiple objects, boxes or the like, even where the proper alignment occurs many feet above the operator's head. The system comprises in general means to produce a relatively focused or controlled beam of visible light, preferably produced by a laser, where the beam is forwardly directly between the forks in a generally horizontal plane common to the forks themselves, such that the height of the forks is indicated by the height and location of the visible indicator, a dot or the like, produced by the beam when it strikes an object, such as a pallet, shelf or rack, or the load on the pallet, or by it disappearing into the void created by the pallet access opening. By raising or lowering the fork carriage such that the light beam strikes the middle support or a midpoint in the central leg of a single-deck member pallet, or by observing when the light indicator or spot produced by the beam disappears as it is directed into the access opening of the pallet, the operator is provided a visual indication that the forks are properly oriented relative to the pallet. Conversely, if the spot produced by the beam appears on the load, the shelf or the upper or lower portion of the pallet, the operator knows that the forks are improperly aligned and can raise or lower them accordingly before moving forward to insert the forks into the pallet.

The apparatus is mounted onto the carriage to which the forks are mounted in a manner such that the beam is emitted at a height equal to the vertical midpoint of the forks and at some point between the forks, preferably at the lateral midpoint between the forks, whereby the apparatus itself is raised or lowered correspondingly with the forks. The forward extension of the apparatus is minimized such that it does not extend forward beyond the vertical brace stop members, where the combination of the vertical brace stop members and the forks themselves are relatively L-shaped, or beyond the forward side of the carriage where the carriage itself acts as the vertical component limiting load movement in the rearward horizontal direction. Preferably, the apparatus comprises a vertically elongated battery housing containing one or more rechargeable batteries with a laser housing containing the laser producing components affixed to the bottom of the battery housing. Brackets are joined at the upper and lower ends of the battery housing for securing the apparatus by mechanical fasteners to the carriage of the fork lift.

Preferably, the apparatus is equipped with one or more safety features to reduce or prevent danger to personnel and to the beam producing means. The apparatus may comprise vibration-responsive actuation means, whereby the beam producing means is not operational unless the forklift is in motion or vibrations from the forklift motor are sensed. The apparatus may comprise height-responsive actuation means, whereby the beam producing means is not operational unless the apparatus is raised above a predetermined minimal distance from the floor. The apparatus may comprise distance-to-load-responsive actuation means, whereby the beam producing means is not operational unless the apparatus is closer than a predetermined maximum distance from the load, or within a predetermined maximum and minimum distance from the load. The apparatus may comprise temperature-responsive actuation means, whereby the beam producing means is only operational at temperatures below a predetermined maximum temperature, at temperatures above a predetermined minimum temperature, or within the range between the maximum and minimum temperatures.

DETAILED DESCRIPTION OF THE INVENTION

With reference to the drawings, the invention will now be described in detail with regard for the best mode and the preferred embodiment. In general, the invention is an apparatus adapted to be mounted onto the forklift carriage of a forklift such that a relatively focused beam of light is projected forward between the forks to provide a generally concise visual indication to the operator of the exact vertical position of the forks.

Figure 1:
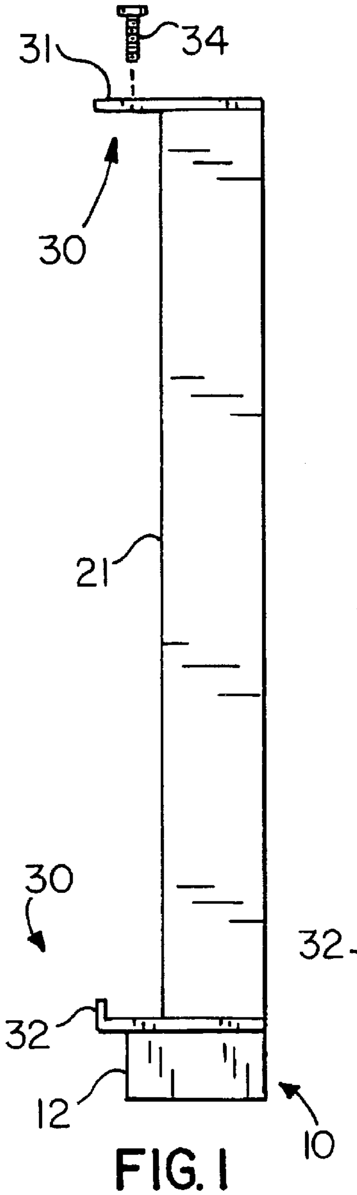
FIG. 1 is a side view of an embodiment of the apparatus.
Figure 2:
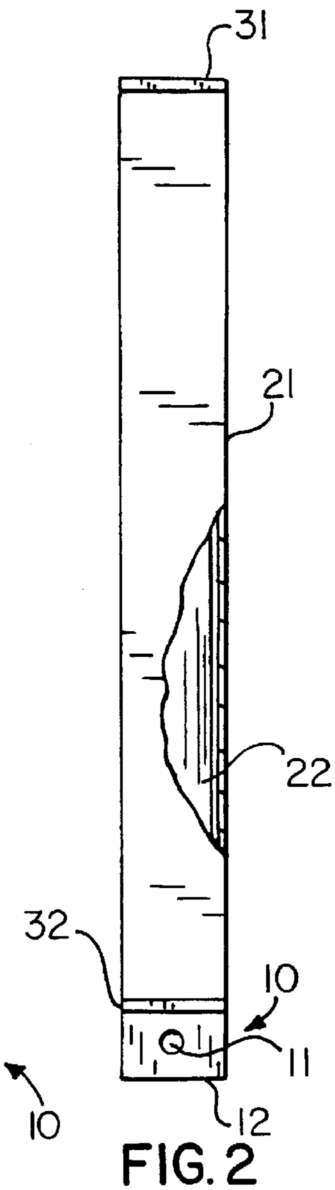
FIG. 2 is a front view of the same embodiment of the apparatus, with a portion partially exposed to reveal the battery.
Figure 4:
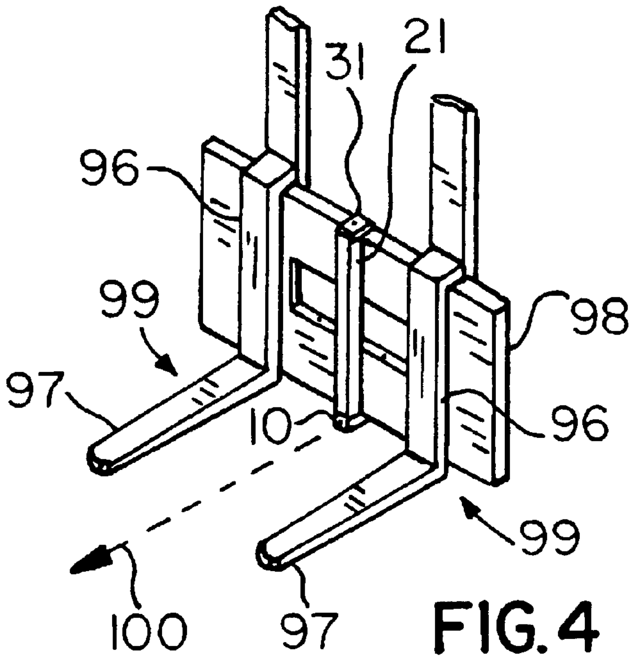
FIG. 4 is a perspective view of the apparatus shown as mounted onto the carriage of a forklift.

As shown in FIGS. 1, 2 and 4, the invention comprises a light beam emitting means 10 which is mounted onto the carriage 98 of a forklift or similar piece of equipment, the carriage 98 being the vertically movable panel member or cross beams onto which the forks 99 are mounted. The forks 99 extend forward in a parallel configuration, and are adapted to fit into the access openings of a pallet 101 designed to carry a load 102. With the forks 99 inserted into the pallet 101, the pallet 101 can be raised from a shelf or stack for transport. The forks 99 are inserted by raising or lowering the carriage 98 to the proper height relative to the pallet 101 and then advancing the forklift forward. The forks 99 fit between the legs of a single deck pallet or between the upper and lower deck members of the two deck pallet. The forks 99 are typically L-shaped, each with a horizontal forward-extending member 97 and vertical load stop member 96, or a portion of the carriage 98 itself may act as the load stop member. Such constructions for forklifts are well known in the industry.

The light beam emitting means 10 may comprise any suitable apparatus for producing a collimated or focused beam of light 100 in the visible spectrum, such as standard light bulbs or LED's in combination with focusing lenses or mirrors, but is preferably comprised of a laser module 11 which produces a controlled light beam 100 in a manner such that the beam 100 results in the appearance of a dot or similar controlled shape on any opaque object in the path of the light beam 100. For example, laser modules 11 containing a diode and focusing lens arrangement producing a beam 100 with wavelength between 670 to 635 nm are suitable, the laser module 11 creating a visible red dot when an object is struck. Other colors may be produced used different wavelength ranges. Such laser modules 11 are well known in the industry. The laser module 11 is mounted within a laser housing 21, such as a generally rectangular plastic or metal box, which is positioned such that the beam 100 is emitted horizontally on the same plane containing the vertical midline of the forks 99, and most preferably centrally between the two forks 99 such that the beam 100 indicates the midpoint between the forks 99. The laser housing 12 is most preferably mounted onto the carriage 98 such that it does not extend in the forward direction beyond the forward side of the vertical load stop members 96 or the forward side of the carriage 98 where it is the load stop. In this manner the forward side of the laser housing 12 does not contact the pallet 101 even when the forks 99 are fully inserted into the pallet 101, thereby protecting the laser module 11 and other components from damage.

Figure 6:
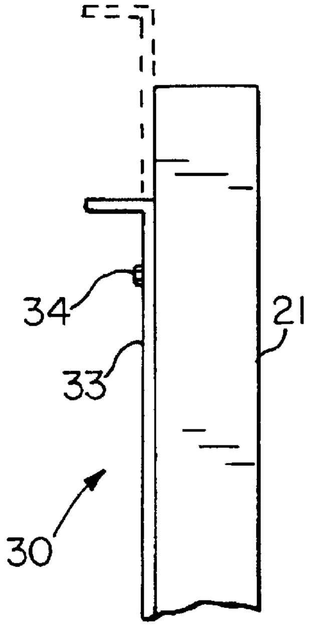
FIG. 6 is a partial side view of an alternative embodiment of the apparatus, illustrating a vertically adjustable bracket member.

The laser housing 12 may be adjoined to the bottom of a battery housing 21 which is adapted to contain a battery 22 for powering the laser beam emitting means 10, with the battery 22 preferably being a rechargeable battery of a type well known in the industry, such as a rechargeable nickel metal hydride battery having an average life of 40 hours before recharging. The battery housing 21 as shown is a generally elongated rectangular member to which is attached mounting means 30 for connecting the apparatus to the forklift carriage 98. Preferably, the battery housing is less than 1.5 inches deep, as most fork vertical load stop members 96 are at least 1.5 inches deep. As shown in FIGS. 1 and 2, the mounting means 30 may comprise an upper bracket member 31 adapted to receive a mechanical fastener 34, such as a threaded bolt, and a lower bracket member 32 having a hook-like configuration which can be abutted against the underside of the carriage 98, with the length of the battery housing 21 determined by the vertical dimension of the carriage 98. Alternatively, the mounting means 30 may comprise an adjustable bracket member 33 mounted to the back of the battery housing 21, where the adjustable bracket member 33 has adjustment means such as a vertical slot adapted to receive a mechanical fastener 34, where the position of the adjustable bracket member 33 relative to the battery housing 21 may be changed to accommodate different carriage 98 vertical dimensions, as shown in FIG. 6.

Figure 5:
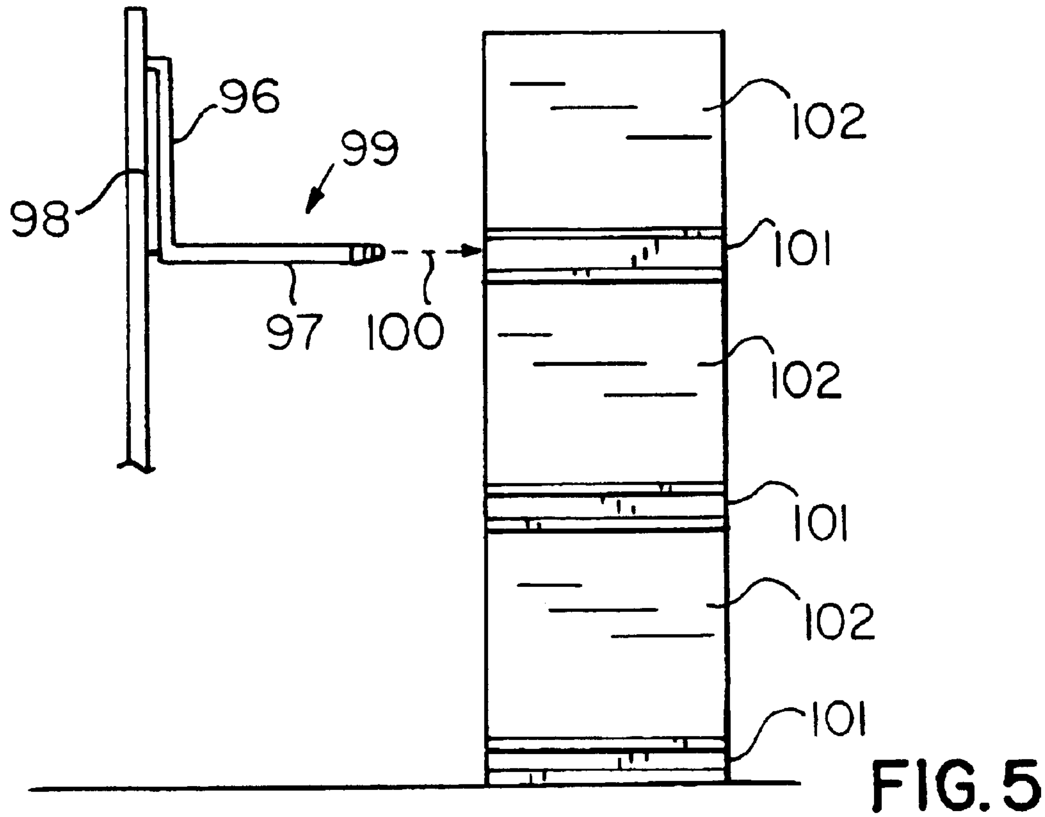
FIG. 5 is a representative side view showing the elevated forks properly aligned with a pallet.

With the laser module 11 properly aligned with the forks 99, the projected light beam 100 provides a visual indicator to the forklift operator of the height of the forks 99 relative to the object upon which the beam 100 impinges. As shown in FIG. 5, with the forks 99 at the correct height, a centrally mounted beam 100 will either strike the center leg or support of a pallet 101, or where no center leg or support is present will disappear into the access opening of the pallet 101, thereby indicating to the operator that the forks 99 are correctly positioned for insertion. Conversely, if the forks 99 are not at the proper height, the light beam 100 will impinge on the upper or lower deck members of the pallet 101, or on the load 102 or a shelf or support rack. The position of the visible dot on these objects indicates to the operator whether the forks 99 need to be raised or lowered.

Figure 3:
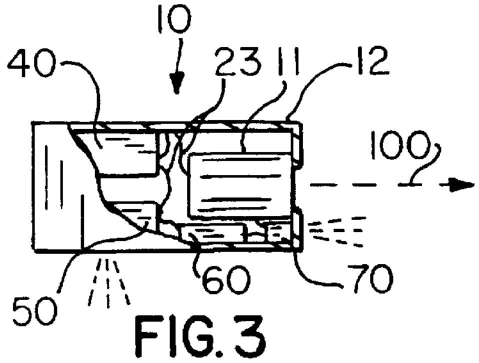
FIG. 3 is an exposed side view of the light beam emitting means, also illustrating the vibration-responsive actuation means, the height-responsive actuation means, the load-to-distance-responsive actuation means and the temperature-responsive actuation means.

In the preferred embodiment of the invention, the apparatus is provided with one or more actuation means 40, 50, 60 and 70 to control the operational state of the laser module 11 at any given moment, as shown representationally in FIG. 3. The purpose of these actuation means 40, 50, 60, 70 is to prolong battery life, to provide a safety margin to persons in the vicinity of the apparatus, and to preclude damage to the laser module 11 from operation in excessively high ambient temperatures. To this end, one or more actuation means 40, 50, 60, 70 are provided in circuit between the battery 22 and the laser module 11 through connector wires 23, in known manner to act as switches to either enable or prevent completion of the electrical circuit.

Vibration-responsive actuation means 40 is a switch of a type known in the industry which provides for an open circuit only when sufficient vibration is sensed, such as from the operation or the forklift motor or movement of the forklift. When there are no or insufficient vibrations sensed, the circuit is closed and the laser module 11 will not operate. This precludes the need for an actuation switch or button which must be manually activated and deactivated, thereby saving battery life and ensuring that the laser beam 100 is produced only when the forklift is operational. Height-responsive actuation means 50 is a switch of a type known in the industry, such as for example a photosensor or sonar range finding system, which provides for an open circuit only when the laser module 11 is raised a predetermined minimal distance from the ground. This not only saves battery life, but also prevents accidental aiming of the beam 100 into a person's eyes. Thus for example, the minimum height for actuation could be set at seven feet, such that the laser module 11 is nonoperational at any lower height. Distance-to-load-responsive actuation means 70 is a switch of known type in the industry, which may be similar in operation to the height-responsive actuation means 50, which provides for an open circuit only when the laser module 11 is positioned closer than a maximum distance from the load 101 or pallet 100, or within a predetermined maximum and minimum distance range. Thus for example, the maximum distance may be set at ten feet, such that the laser module is inoperable until the laser module is less than this distance from the load 101, and the minimum distance may be set at one foot, such that the laser module 11 turns off when the forks 99 are inserted into the pallet 101. Temperature-responsive actuation means 60 is a switch of a type known in the industry, such as a thermostat, which provides for an open circuit only when the ambient temperature is below a predetermined maximum temperature, above a predetermined minimum temperature, or within the range between a predetermined maximum temperature and a predetermined minium temperature. Operation of laser modules 11 in high temperature conditions or low temperature conditions can be detrimental to the laser module 11, so the maximum temperature may be set at 45 degrees C., for example, such that the laser module 11 will only operate at temperatures below this setting, and the minimal temperature may be set at 0 degrees C., for example, such that the laser module 11 will operate only at temperatures above this setting. Any or all of these actuation means 40, 50, 60, 70 may be incorporated into the invention, along with time delay circuits such that the actuation or non-actuation is not immediate when one of the conditions is encountered.

It is understood that certain equivalents and substitutions for elements set forth above may be obvious to those skilled in the art, and thus the true scope and definition of the invention is to be as set forth in the following claims.

I claim:

1. An apparatus for properly aligning the forks of a forklift relative to a pallet by providing a visual indication to the forklift operator in the form of a visible indicator on an opaque surface, said apparatus adapted to be mounted onto the carriage carrying the forks of a forklift and comprising:

light beam emitting means producing a generally focused beam creating a visible indicator on a solid object;

mounting means adapted for attachment of said light beam emitting means between the forks of a forklift;

temperature-responsive actuation means, wherein the operational state of said light beam emitting means is controlled by said temperature-responsive actuation means, such that said light beam emitting means is not operational unless the ambient temperature is below a particular temperature;

whereby said beam is emitted in approximately the same horizontal plane containing the vertical midlines of said forks such that said visible indicator provides an indication of the height of said forks.

2. The apparatus of claim 1, wherein said light beam emitting means is attached at the lateral midpoint between said forks.

3. The apparatus of claim 1, wherein said light beam emitting means comprises a laser module.

4. The apparatus of claim 1, wherein said forks each comprise a horizontal forward extending member and vertical load stop member, and wherein said light beam emitting means does not extend forward beyond said vertical load stop members.

5. The apparatus of claim 1, further comprising vibration-responsive actuation means, wherein the operational state of said light beam emitting means is controlled by said vibration-responsive actuation means, such that said light beam emitting means is not operational unless vibrations are sensed.

6. The apparatus of claim 1, further comprising height-responsive actuation means, wherein the operational state of said light beam emitting means is controlled by said height-responsive actuation means, such that said light beam emitting means is not operational unless said laser module is positioned above a particular height.

7. The apparatus of claim 1, further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

8. The apparatus of claim 5, further comprising height-responsive actuation means, wherein the operational state of said light beam emitting means is controlled by said height-responsive actuation means, such that said laser module is not operational unless vibrations are sensed and said light beam emitting means is positioned above a particular height.

9. The apparatus of claim 5, further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

10. The apparatus of claim 6, further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

11. The apparatus of claim 5, further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

12. An apparatus for providing a visual indication of the proper vertical alignment of the forks of a forklift relative to a pallet, wherein the forks are mounted onto a vertically movable carriage and comprising:

light beam emitting means comprising a laser module producing a beam of visible light creating a focused visible indicator on a solid object;

a laser housing retaining said laser module;

a battery housing containing a battery, wherein said battery housing is connected to said laser housing;

mounting means adapted for attachment of said light beam emitting means to the carriage of the forklift, said mounting means comprising at least one mechanical fastener and bracket members connected to said laser housing and said battery housing, whereby said beam is emitted in approximately the same horizontal plane containing the vertical midlines of said forks, such that the height of said beam equals the height of said forks;

further comprising vibration-responsive actuation means, wherein the operational state of said laser module is controlled by said vibration-responsive actuation means, such that said laser module is not operational unless vibrations are sensed.

13. An apparatus for providing a visual indication of the proper vertical alignment of the forks of a forklift relative to a pallet, wherein the forks are mounted onto a vertically movable carriage and comprising:

light beam emitting means comprising a laser module producing a beam of visible light creating a focused visible indicator on a solid object;

a laser housing retaining said laser module;

a battery housing containing a battery, wherein said battery housing is connected to said laser housing;

mounting means adapted for attachment of said light beam emitting means to the carriage of the forklift, said mounting means comprising at least one mechanical fastener and bracket members connected to said laser housing and said battery housing, whereby said beam is emitted in approximately the same horizontal plane containing the vertical midlines of said forks, such that the height of said beam equals the height of said forks;

further comprising temperature-responsive actuation means, wherein the operational state of said laser module is controlled by said temperature-responsive actuation means, such that said laser module is not operational unless the ambient temperature is below a particular temperature.

14. An apparatus for providing a visual indication of the proper vertical alignment of the forks of a forklift relative to a pallet, wherein the forks are mounted onto a vertically movable carriage and comprising:

light beam emitting means comprising a laser module producing a beam of visible light creating a focused visible indicator on a solid object;

a laser housing retaining said laser module;

a battery housing containing a battery, wherein said battery housing is connected to said laser housing;

mounting means adapted for attachment of said light beam emitting means to the carriage of the forklift, said mounting means comprising at least one mechanical fastener and bracket members connected to said laser housing and said battery housing, whereby said beam is emitted in approximately the same horizontal plane containing the vertical midlines of said forks, such that the height of said beam equals the height of said forks;

further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

15. An apparatus for properly aligning the forks of a forklift relative to a pallet by providing a visual indication to the forklift operator in the form of a visible indicator on an opaque surface, said apparatus adapted to be mounted onto the carriage carrying the forks of a forklift and comprising:

light beam emitting means producing a generally focused beam creating a visible indicator on a solid object;

mounting means adapted for attachment of said light beam emitting means between the forks of a forklift;

vibration-responsive actuation means, wherein the operational state of said light beam emitting means is controlled by said vibration-responsive actuation means, such that said light beam emitting means is not operational unless vibrations are sensed;

whereby said beam is emitted in approximately the same horizontal plane containing the vertical midlines of said forks such that said visible indicator provides an indication of the height of said forks.

16. The apparatus of claim 15, further comprising distance-to-load-responsive actuation means, wherein the operational state of said light beam emitting means is controlled by said distance-to-load-responsive actuation means, such that said light beam emitting means is not operational unless said laser module is located closer than a predetermined distance from said solid object.

17. The apparatus of claim 15, further comprising height-responsive actuation means, wherein the operational state of said light beam emitting means is controlled by said height-responsive actuation means, such that said light beam emitting means is not operational unless said laser module is positioned above a particular height.

18. The apparatus of claim 16, further comprising height-responsive actuation means, wherein the operational state of said light beam emitting means is controlled by said height-responsive actuation means, such that said light beam emitting means is not operational unless said laser module is positioned above a particular height.

19. An apparatus for properly aligning the forks of a forklift relative to a pallet by providing a visual indication to the forklift operator in the form of a visible indicator on an opaque surface, said apparatus adapted to be mounted onto the carriage carrying the forks of a forklift and comprising:

light beam emitting means producing a generally focused beam creating a visible indicator on a solid object;

mounting means adapted for attachment of said light beam emitting means between the forks of a forklift;

distance-to-load-responsive actuation means, wherein the operational state of said light beam emitting means is controlled by said distance-to-load-responsive actuation means, such that said light beam emitting means is not operational unless said laser module is located closer than a predetermined distance from said solid object whereby said beam is emitted in approximately the same horizontal plane containing the vertical midlines of said forks such that said visible indicator provides an indication of the height of said forks.

20. The apparatus of claim 19, further comprising height-responsive actuation means, wherein the operational state of said light beam emitting means is controlled by said height-responsive actuation means, such that said light beam emitting means is not operational unless said laser module is positioned above a particular height.

* * * * *